United States Patent [19]

Rein

[11] Patent Number: 4,630,046
[45] Date of Patent: Dec. 16, 1986

[54] BROADBAND SWITCHING NETWORK IN MATRIX FORM

[75] Inventor: Hans-Martin Rein, Witten, Fed. Rep. of Germany

[73] Assignee: ANT Nachrichtentechnik GmbH, Backnang, Fed. Rep. of Germany

[21] Appl. No.: 688,161

[22] Filed: Dec. 31, 1984

[30] Foreign Application Priority Data

Jan. 5, 1984 [DE] Fed. Rep. of Germany ....... 3400217

[51] Int. Cl.$^4$ ............................ H04Q 9/00; H04J 3/02
[52] U.S. Cl. ............................ 340/825.93; 340/825.92; 330/104; 370/58
[58] Field of Search ...................... 340/825.93, 825.87, 340/835.92; 333/104; 179/18 GF; 370/60, 58

[56] References Cited

U.S. PATENT DOCUMENTS

| | | | |
|---|---|---|---|
| Re. 28,224 | 11/1974 | Metcalf | 340/825.92 |
| 3,550,087 | 12/1970 | Ross | 340/825.93 |
| 4,331,950 | 5/1982 | Barabas | 340/825.87 |
| 4,346,381 | 8/1982 | Bauch et al. | 340/825.93 |
| 4,443,773 | 4/1984 | Rall et al. | 330/104 |
| 4,446,552 | 5/1984 | Tweedy | 370/58 |
| 4,516,238 | 5/1985 | Huang et al. | 370/60 |

FOREIGN PATENT DOCUMENTS 2917989 11/1980 Fed. Rep. of Germany .

Primary Examiner—Donald J. Yusko
Attorney, Agent, or Firm—Spencer & Frank

[57] ABSTRACT

A broadband switching network in matrix form composed of a plurality of rows and a plurality of columns, and including a plurality of crosspoint switching circuits each having an input and an output and each associated with a respective row and a respective column; a plurality of input circuits each associated with a respective row and connected to the input of each switching circuit associated with the respective row; and a plurality of output circuits each associated with a respective column and connected to the output of each switching circuit associated with the respective column. Each crosspoint switching circuit includes a transistor connected in common emitter configuration and control elements connected for applying to the emitter of the transistor a potential controlling the switching state of the crosspoint switching circuit and each input circuit and output circuit is a decoupling circuit. The network further includes a plurality of load resistors each associated with a respective column and each connected to that output circuit which is associated with the respective column, and a plurality of self-blocking stages each including a transistor connected in common base configuration and each connected in series between the output of at least one switching circuit and that load resistor which is associated with the same column as the at least one switching circuit.

10 Claims, 5 Drawing Figures

BROADBAND SWITCHING NETWORK IN MATRIX FORM

BACKGROUND OF THE INVENTION

The present invention relates to a broadband switching network composed of a network of crosspoint switching circuits of the type disclosed in U.S. Pat. No. 4,346,381.

The switching circuits of this switching network are constructed according to ECL (emitter coupled logic) technology and are composed of differential amplifier stages whose emitter branches each include a negative feedback resistor and a transistor. The base of this transistor is charged with a control signal so as to switch through or open the crosspoint. These differential amplifiers must receive additional reference signals. Moreover, for many applications, the switching network of U.S. Pat. No. 4,346,381 provides insufficient decoupling between the signal lines in the row and column directions. In this switching network, it is not very easily possible to combine a plurality of crosspoints of a column into groups and switch them to one output stage.

U.S. Pat. No. 4,443,773 discloses a broadband switching network in matrix form in which compensation elements are provided to eliminate residual overcoupling at blocked crosspoints. However, this switching network requires ground-symmetrical amplifiers which brings about added expenditures for supply lines and switching elements.

Federal Republic of Germany Offenlegungsschrift (Laid-Open Application) No. 2,917,989 discloses a switching network which employs FET's (field effect transistors) as crosspoints. These crosspoints are of asymmetrical design. At higher frequencies, the reverse resistances of these FET's are known to be determined by the parasitic capacitances between their electrodes. To avoid this drawback, the switching network disclosed in that publication provides that the output signal of a column is returned, via an amplifier stage, to the bulk terminals of the FET's. The load capacitances, however, can be reduced by this measure only by about three times their value. It is not possible with this arrangement to link very many outputs together. Additionally the transmittable bit rate is considerably lower than that which can be achieved using bipolar technology.

SUMMARY OF THE INVENTION

It is therefore an object of the present invention to provide a broadband switching network which can conduct high bit rate signals with sufficiently high insertion loss, or non-pass attenuation, and in which the signal delay time through the switching network matrix depends only slightly on the number of crosspoints switched through per row.

The above and other objects are achieved, according to the invention, by a broadband switching network in matrix form composed of a plurality of rows and a plurality of columns, and comprising: a plurality of crosspoint switching circuits each having an input and an output and each associated with a respective row and a respective column; a plurality of input circuits each associated with a respective row and connected to the input of each switching circuit associated with the respective row; and a plurality of output circuits each associated with a respective column and connected to the output of each switching circuit associated with the respective column, wherein each crosspoint switching circuit comprises a first transistor connected in common emitter configuration and control means connected for applying to the emitter of the first transistor a potential controlling the switching state of the crosspoint switching circuit, each input circuit and output circuit is a decoupling circuit, and the network further comprises: a plurality of load resistors each associated with a respective column and each connected to that one of the output circuits associated with the respective column; and a plurality of self-blocking stages each comprising a second transistor connected in common base configuration and each connected in series between the output of at least one switching circuit and that one of the load resistors associated with the same column as the at least one switching circuit.

The present invention is characterized by low power losses and a small number of components, resulting in a space having design. In contrast to the current switching crosspoint, the asymmetrical design requires neither a ground potential nor a reference voltage at the crosspoint switching circuit. The space required for the corresponding lines is here eliminated. The series negative feedback makes the input impedance of the crosspoint so high that the signal delay time through the matrix depends only slightly on the number of crosspoint switching circuits switched through per row. The broadband switching network is highly integratable and ECL compatible. For example, it permits switching through of digital video signals having a frequency of at least 140 Mbit/s with sufficiently low cross-coupling.

The present invention will now be described in greater detail with reference to the drawings.

DESCRIPTION OF THE PREFERRED EMBODIMENTS

Figure 1:
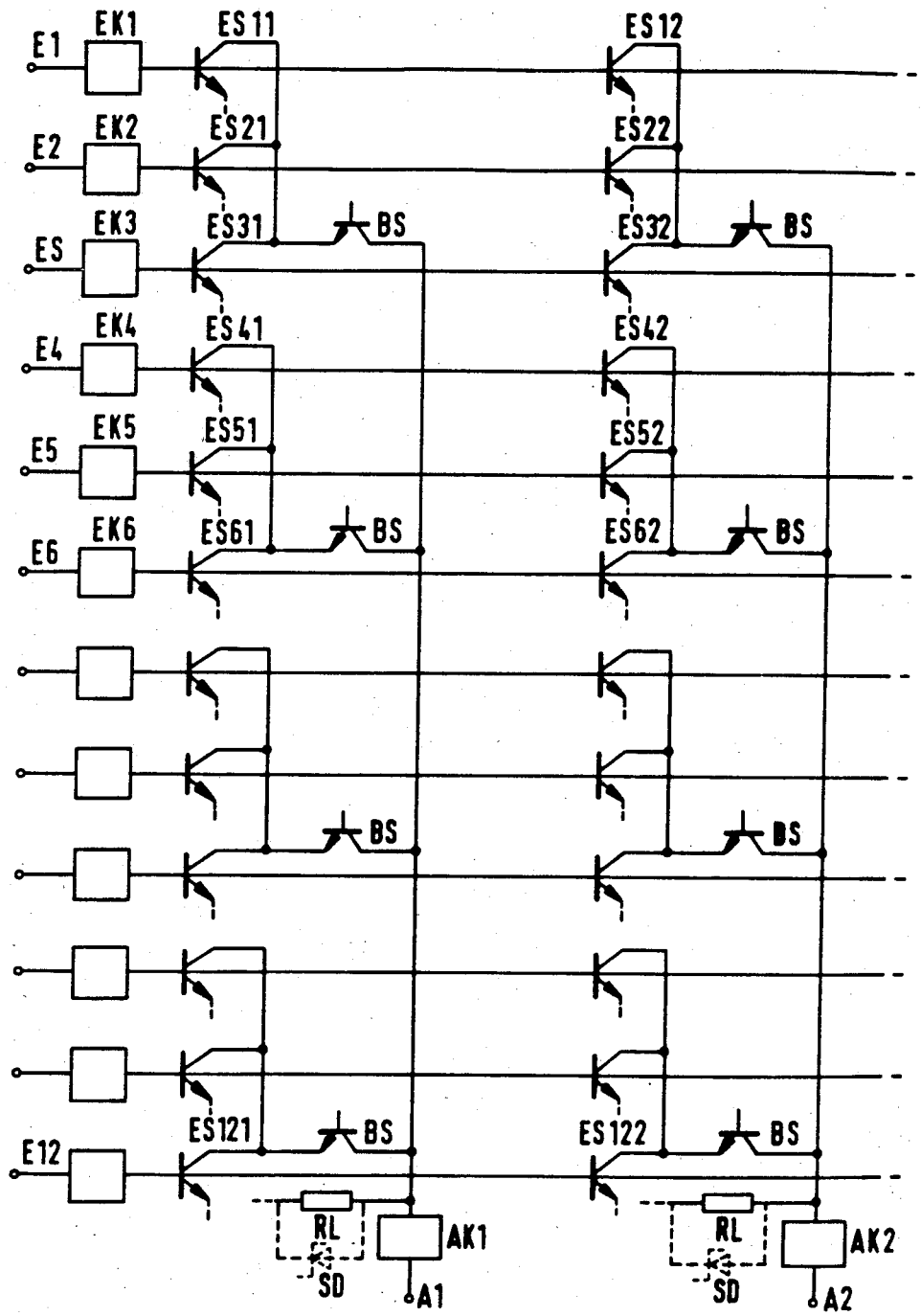
FIG. 1 is a circuit diagram showing the basic design of the switching network according to the present invention with rows of crosspoint switching circuits which are combined into groups.

FIG. 1 shows the basic structure of a broadband switching network in the form of a switching matrix composed of m rows and n columns. The signals to be switched through, for example digitalized video signals, are supplied in the row direction through inputs E1, E2, E3, . . . , Em. The switched-through signals are discharged in the column direction through outputs A1, A2, . . . , An. In the illustrated circuit, m=12. The crosspoint switching circuits comprise emitter stages ES11, ES12, ES13, . . . , ES21, ES22, ES23, . . . , ES31, ES32, ES33, . . . , etc., each formed by a respective transistor. The input of each emitter stage is constituted by the transistor base and the inputs of each row m are conductively connected together.

Figure 2:
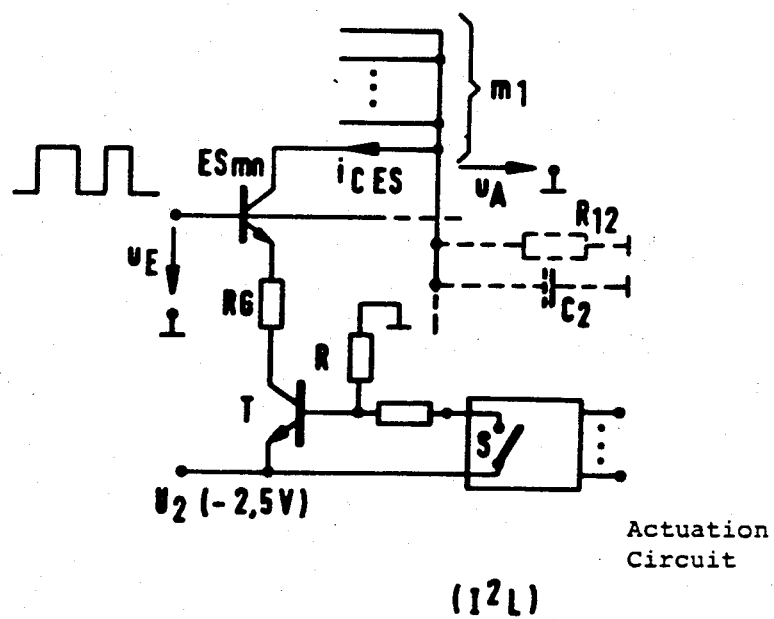
FIG. 2 is a detailed circuit diagram of one crosspoint switching circuit.

FIG. 2 shows the details of the configuration of one crosspoint switching circuit with an associated actuation circuit. The m crosspoints of each column are here combined into $m_2$ blocks each composed of $m_1$ crosspoints ($m_2 = 1, \ldots, m$). In the embodiment of FIG. 1, $m_1 = 3$ and $m_2 = 4$. The connected outputs of every $m_1$ crosspoints are connected to a respective self-blocking common base stage BS. Self-blocking common base stage will mean that this stage cannot produce an output signal if its input is not supplied with a driving signal. In the specific example of FIG. 1, four base stages are required per column. The outputs of the base stages BS of each column are connected to a respective common load resistance $R_L$. The optimum value of $m_2$ (number of blocks) depends on marginal conditions, e.g. power dissipation of the switching network.

In the following specification common emitter stage and common base stage is identified as emitter stage and base stage respectively. The outputs of the base stages BS of each column are connected together and lead to a common load resistance RL for each column. Each row has one decoupling stage EK1, EK2, EK3, ..., EKm at its input. Likewise each column has one decoupling stage AK1, AK2, ..., AKn at its output A1, A2, ..., An. The specific configuration of the decoupling stages EK and AK will be described in greater detail with reference to FIG. 3.

FIG. 2 shows a single crosspoint switching circuit. The base of the transistor of emitter stage ESmn receives the signal $u_E$ to be switched through and the collector of that transistor provides the stage output current $i_{CES}$. A series connection of a resistor RG and the switching path of a transistor T lies in the emitter branch of the transistor of stage ESmn. Resistor R stabilizes the common emitter stage due to negative current feedback. The value for resistor R mainly depends on the voltage $u_A$ and the gain of the transistor of stage $ES_{mn}$, and can be easily determined according to known design principles. The base of transistor T is connected to circuit ground via a resistor R. The transistor of stage ESmn and transistor T are here npn transistors. Due to the series negative feedback for the emitter stage by means of resistor RG, the input impedance of the crosspoint switching circuit becomes so high that the signal delay time through the matrix depends only slightly on the number of crosspoints switched through per row.

The base-emitter path of transistor T is connected in parallel with a switch S with which the switch-through paths are selected. With switch S open, transistor T is saturated and the associated crosspoint is switched through. Switch S, as a component of an I$^2$L logic actuation circuit, is activated by means of a conventional enabling circuit (not shown). The holding members are also not shown.

If, however, the switch of FIG. 2 is closed, then T is blocked and thus the crosspoint is switched off. Since the current through R is much less than $I_{CES}$ (e.g. $I_{ECS}/5 \ldots I_{CES}/10$), the power consumption is also considerably less than when the crosspoint is switched through. But even in the switched-through state, power consumption is relatively low since it is possible to operate with a low supply voltage $U_2$ and, in spite of the high signal bit rate, with a small output current $I_{CES}$/for switching. The power losses are reduced even further in that, on the average, only half the maximum current ($I_{CES}/2$) flows during the switched-through state—in contrast to a current switching crosspoint. A supply voltage $U_2 = -2.5$ V is present at the emitter of transistor T. As also shown in FIG. 1, the collectors of $m_1$ emitter stages ESmn are connected together. A signal voltage $u_A$ is available to actuate the associated base stage BSmn, voltage $u_A$ being shown in FIG. 2.

In principle, it is possible to connected each emitter stage ESmn individually to a respective base stage BSmn. However, this does not result in any additional advantages, concerning the highest usable bit rate as will be shown below. Moreover, the number of components which would then be required is considerable. Thus, one will always attempt, insofar as external marginal conditions permit, so select a small value for $m_2$.

Figure 3:
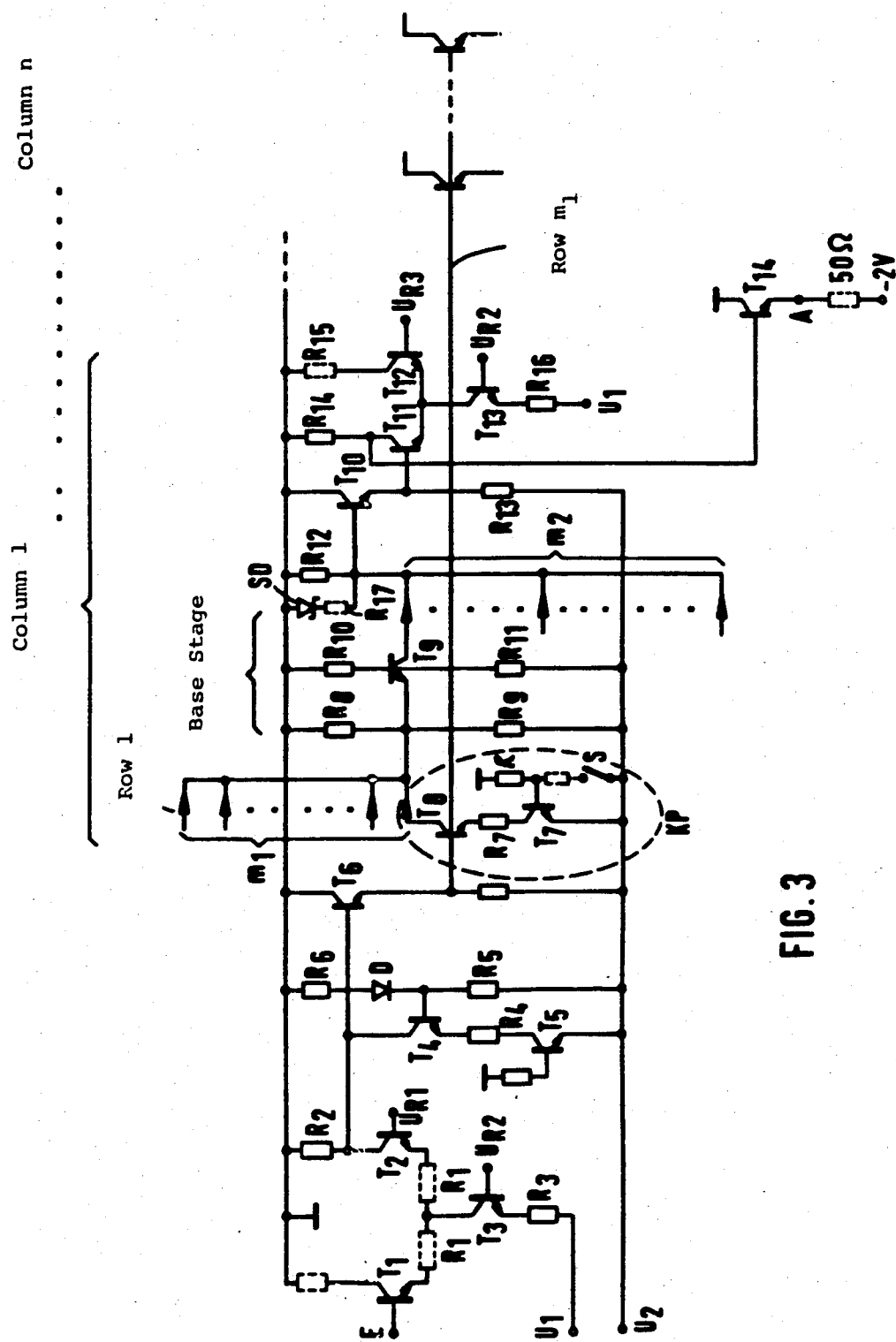
FIG. 3 is a detailed circuit diagram showing the current flow plan of a crosspoint switching circuit with a decoupling stage at the input and at the output.

FIG. 3 shows a crosspoint switching circuit and decoupling stages at the input and output in a current flow plan. The input E in the row direction is followed by an input decoupling stage identified as EKm in FIG. 1. This decoupling stage is composed of a differential amplifier-transistors $T_1$ and $T_2$—and of an emitter follower constituted by a grounded-collector transistor stage $T_6$ connected to the output of the differential amplifier. In the common emitter line of $T_1$ and $T_2$, there is provided a transistor $T_3$ connected in series with a resistor $R_3$. A resistor $R_1$, shown in dashed lines, may be included in the emitter branch of $T_1$ and also a resistor $R_1$ in the emitter branch of $T_2$. The resistors $R_1$ are stabilizing the differential amplifier stage due to negative current feedback. The terminal of resistor $R_3$ remote from the emitter of $T_3$ is charged with a supply voltage $U_1$ of, for example, $-5$ V.

The collector of transistors $T_1$ and $T_2$ lead, via operating resistors, to ground potential. Operating resistor $R_2$ of transistor $T_2$ is connected in parallel with the collector-base path of emitter follower $T_6$. The operating resistor of $T_1$ (shown in dashed lines) may be omitted so as to reduce the input capacitance.

The input decoupling stage is ECL compatible. Due to the negative feedback connection $R_1$ of the current switch, the input capacitance can be reduced so that there is not much load on the external signal line. The two reference voltages $U_{R1}$ an $U_{R2}$ for transistors $T_2$ and $T_3$ are generated, in a manner customary in ECL circuits, by an internal voltage divider. The differential amplifier stage $T_1$, $T_2$ converts the ECL level at input E to an internally more favorable voltage level. In consideration of achieving a small product of switching time and power loss, the voltage maximum at the output of differential amplifier stage $T_1$, $T_2$ is here reduced to about 500 mV.

The output of collector stage $T_6$ is connected with the actual crosspoint switching circuit KP. Collector stage $T_6$ serves to shift the voltage level at the output of the decoupling stage and to drive the row line connected to the available crosspoint switching circuits KP. Collector stage $T_6$ operates as an impedance converter.

Crosspoint switching circuit KP is composed of an emitter stage $T_8$, corresponding to stage ESmn of FIG. 2, in whose emitter current branch there is disposed a resistor $R_7$ as well as, connected in series, the collector-emitter path of transistor $T_7$, corresponding to elements RG and T of FIG. 2. The crosspoint switching circuit is activated by a control signal which opens switch S, as described in connection with FIG. 2. The supply voltage $U_2$, for example $-2.5$ V, is present at the emitter of $T_7$.

As shown in FIG. 3, the m crosspoints of one column are combined, as in FIG. 1, into $m_2$ blocks each having $m_1$ elements. The relatively large column capacitance $C_2$ (FIG. 2) must be recharged only through the connected crosspoints of each block. If the current $i_{CES}$ (amplitude $I_{CES}$) were to suddenly jump, the following would apply, in approximation, for the rise or fall time $t_{rf}$ of voltage $u_A$ across load resistance $R_{12}$ (corresponding to RL of FIG. 1):

$$t_{rf}\omega[(\Delta u_A C_2)/I_{CES}]\omega R C_2$$

where $\Delta u_A$ is the voltage rise. It can be seen that in view of a low switching current $I_{CES}$ (i.e., low power loss), it must be attempted to obtain the lowest possible voltage rise in the column to realize a sufficiently high flank steepness (i.e., the highest possible bit rate).

Other advantages of a low column rise $\Delta u_A$ are:

(a) lower input capacitance of the crosspoints due to reduced Miller effect, thus reducing the row load;

(b) reduction of the interference currents flowing through capacitances $C_{CB}$ of the switched-off crosspoints into the column if the phase position is unfavorable with respect to the signal current;

(c) reduction of interference from parallel running adjacent columns.

A lower column voltage rise can be realized in that a base stage is connected between crosspoint and load resistance. The outputs of the $m_1$ emitter stages of each block are therefore connected with a self-blocking base stage, constituted by transistor $T_9$ in FIG. 3 and BS in FIG. 1. The outputs of the $m_2$ base stages operate on load resistor $R_{12}$ of each column. The base stages permit the creation of steep pulse edges in spite of high capacitive loads in the internal column and increase, particularly for $m_2 > 1$ the insertion loss. Voltage divider $R_8$–$R_9$ further reduces the bias across the input of the blocked base stage precisely to the point where the signal delay during long pulse pauses will not increase unduly, yet the base stage nevertheless blocks reliably. If necessary, a voltage divider $R_{10}$–$R_{11}$ can be used to increase the separation of the on-state of transistor $T_9$ from the saturation limit.

Advisably, a Schottky diode SD is connected in parallel with load resistor $R_{12}$. This brings about the advantage of an increased insertion loss when the base stage is conducting. Moreover, the asymmetry of the voltage transfer characteristic of the crosspoint switching circuit is reduced so that, for example, in a 1010 ... pulse sequence, the pulse/space ratio lies closer to one. If necessary, the Schottky diode SD may be connected in series with a resistor $R_{17}$ (shown in dashed lines). Base stage $T_9$ and Schottky diode SD can be combined by way of a Schottky transistor.

The decoupling stage AK at a column output is composed of an emitter follower stage composed of a transistor $T_{10}$ to shift the level and reduce the load on the base stage, a differential amplifier stage composed of transistors $T_{11}$ and $T_{12}$, in whose common emitter line a transistor $T_{13}$ is connected to impress the emitter current, similarly as at the input of a differential amplifier, and a further emitter follower stage composed of a transistor $T_{14}$. Transistors $T_{11}$, $T_{12}$ and $T_{13}$ form a current switch which operates to regenerate the pulses supplied to the column output and to amplify them approximately by a factor of two to the conventional ECL rise. The further emitter follower $T_{14}$ has such dimensions that it is able to drive terminated lines.

If all crosspoints of a row are switched off, the associated output is at the logic L level. Thus it is possible to link together corresponding outputs A of a plurality of matrixes in a "wired-or" manner. By way of this broadening, a larger matrix with a correspondingly larger number of inputs (rows) is realized. The decoupling stage at the output is therefore also ECL compatible. An external load of 50 Ohms is shown in dashed lines in FIG. 3.

Between the differential amplifier $T_1$, $T_2$ at the input and the collector stage $T_6$ there is disposed a compensation stage which causes the current through the crosspoint switching circuit and thus the voltage rise in the internal column (across load resistor $R_{12}$) to become approximately independent of fluctuations in supply voltage $U_2$, of temperature and of the output voltage of transistor $T_7$. The compensation stage is composed of two transistors $T_4$ and $T_5$ whose collector-emitter paths are connected in series with one another via a series resistor $R_4$. The collector of the first transistor $T_4$ is connected with the output of the input differential amplifier—transistors $T_1$ and $T_2$—and its emitter with the series resistor $R_4$. The collector of the second transistor $T_5$ is connected with the series resistor $R_4$ and its emitter is connected with the supply voltage $U_2$. The base terminal of the first transistor $T_4$ is connected by way of a voltage divider $R_5$, $R_6$ which is disposed between ground and the supply voltage. A diode D is included in the branch adjacent the ground terminal of voltage divider $R_5$, $R_6$. By suitably dimensioning the resistors and transistors of the compensation network, the influence of a change in the collector bulk resistance $r_{c7}$ of $T_7$ on the collector current $I_{CT8}$ can be substantially compensated. For this purpose, transistor $T_5$ with its bulk resistor $r_{c5}$ is provided which is operated in saturation, like transistor $T_7$.

For a current switching crosspoint (differential amplifier stage with controllable switch in the common emitter path) the advantageous circuit comprising a base stage at the output and a Schottky diode in parallel can likewise be used to increase the insertion loss. However, this entails increased expenditures for components and additionally supplied signals (reference voltages).

Figure 4:
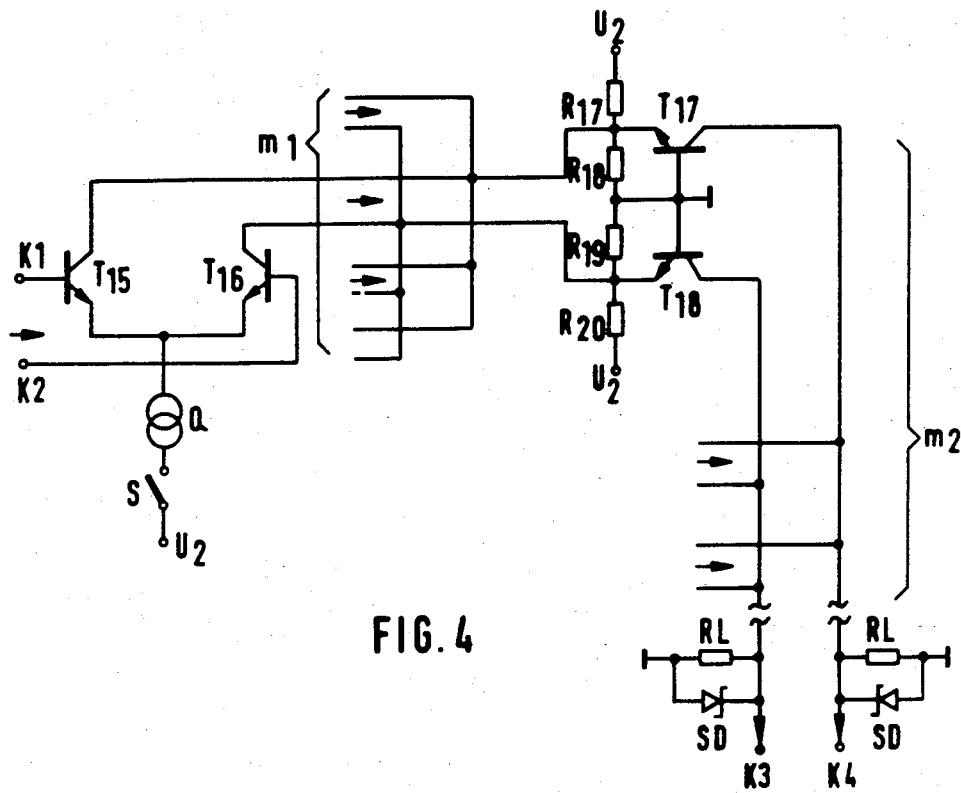
FIG. 4 is a circuit diagram of a crosspoint switching circuit having a symmetrical current switch.
Figure 5:
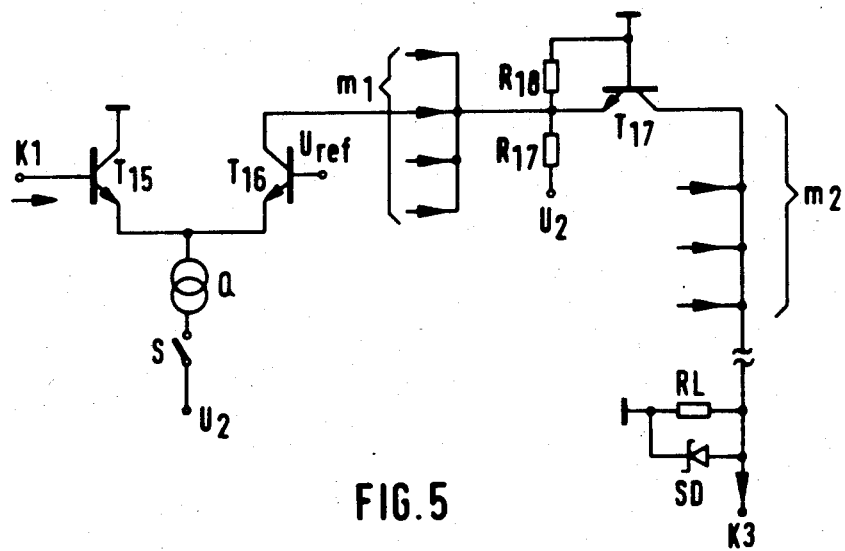
FIG. 5 is a circuit diagram of a crosspoint switching circuit having an asymmetrical current switch.

Circuit realizations of this type are shown in FIGS. 4 and 5. In FIG. 4, the crosspoint switching circuit is constituted by a symmetrical current switch composed of transistors $T_{15}$ and $T_{16}$. The signal conducted over a decoupling stage at the input similarly to that shown in FIG. 3 (not illustrated here) is applied across terminals K1 and K2 to the base terminals of transistors $T_{15}$ and $T_{16}$. In the common emitter branch of $T_{15}$ and $T_{16}$ there is a current source Q which can be switched by means of switch S connected to supply voltage $U_2$ with which the crosspoints to be switched through are selected.

The collectors of transistors $T_{15}$ and $T_{16}$ are each connected with a respective one of base stages $T_{17}$ and $T_{18}$. These two base stages, $T_{17}$ and $T_{18}$, with which the corresponding collectors of $m_1$ crosspoint switching circuits of a block are connected, have their bases connected to ground. Resistor voltage dividers $R_{17}$, $R_{18}$ and $R_{19}$, $R_{20}$, respectively, serve, like voltage divider $R_8$, $R_9$ of FIG. 3, to lower the bias across the inputs of the blocked base stages just enough to prevent the signal delay from increasing unduly when there are long pulse pauses, while assuring that the base stages still block reliably. There are $m_2$ such double base stages and their respective outputs are connected with a respective common load resistor RL which is connected in parallel with a Schottky diode SD. The output terminals K3 and K4 are followed by an output decoupling stage which may be configured similarly to that of FIG. 3, but has symmetrical inputs and outputs.

The crosspoint switching circuit of FIG. 5 is designed similarly to that of FIG. 4, but as an asymmetrical current switch. Only transistor $T_{15}$ is actuated by a signal originating from the input decoupling stage. Its collector is connected to ground potential. The base of transistor $T_{16}$ is charged with a reference voltage $U_{ref}$ and its collector is connected to the subsequent base stage $T_{17}$, only one of which is provided for each block. Thus, the number of such base stages $T_{17}$ is $m_2$ and all operate on a common load resistor RL with parallel connected Schottky diode SD.

As tests at a bit rate of 280 Mbit/s (NRZ), an internal voltage rise of approximately 450 mW and with an ECL compatible input and output level have shown, the power loss for a 16×16 matrix is about 880 mW and the delay time through the entire matrix is about 3 ns. Such fast, highly integrated coupling matrixes can be realized with relatively low power consumption using bipolar technology. The bit rate of 280 Mbit/s is given if a 140 Mbit/s signal is to be transmitted in CMI code.

It will be understood that the above description of the present invention is susceptible to various modifications, changes and adaptations, and the same are intended to be comprehended within the meaning and range of equivalents of the appended claims.

What is claimed is:

1. A broadband switching network in matrix form composed of a plurality of rows and a plurality of columns, and comprising: a plurality of crosspoint switching circuits each having an input and an output and each associated with a respective row and a respective column; a plurality of input circuits each associated with a respective row and connected to the input of each said switching circuit associated with the respective row; and a plurality of output circuits each associated with a respective column and connected to the output of each said switching circuit associated with the respective column, wherein each said crosspoint switching circuit comprises a first transistor connected in common emitter configuration and control means connected for applying to the emitter of said first transistor a potential controlling the switching state of said crosspoint switching circuit, each said input circuit and output circuit is a decoupling circuit, and said network further comprises: a plurality of load resistors each associated with a respective column and each connected to that one of said output circuits associated with the respective column; and a plurality of self-blocking stages each comprising a second transistor connected in common base configuration and each connected in series between the output of at least one said switching circuit and that one of said load resistors associated with the same column as said at least one switching circuit.

2. A network as defined in claim 1 wherein each said input circuit comprises a nonlinear, overdriven differential amplifier, and a third transistor connected in common collector configuration and connected to the output of said differential amplifier.

3. A network as defined in claim 2 wherein each said input circuit further comprises a compensation stage connected between said differential amplifier and said third transistor, said compensation stage comprising: a fourth transistor having its emitter connected to the output of said differential amplifier; a series resistor having one side connected to the collector of said fourth transistor; a fifth transistor having its collector connected to the other side of said series resistor; a supply voltage source connected to apply a potential to the emitter of said fifth transistor; a voltage divider connected between said supply voltage source and circuit ground and having a tap connected to the base of said fourth transistor; and a diode connected in said voltage divider between said tap and circuit ground.

4. A network as defined in claim 1 further comprising a plurality of Schottky diodes each connected in parallel with a respective load resistor.

5. A network as defined in claim 1 wherein each said second transistor is a Schottky transistor.

6. A network as defined in claim 1 wherein each said output circuit comprises: a first emitter follower stage comprising a sixth transistor connected in emitter follower configuration and having an input connected to the associated load resistor; a differential amplifier stage having an input connected to the output of said first emitter follower stage; and a second emitter follower stage comprising a seventh transistor connected in emitter follower configuration and having an input connected to the output of said differential amplifier stage.

7. A network as defined in claim 1 wherein each said crosspoint switching circuit comprises a stabilizing resistor connected in circuit with the emitter of said first transistor, and said control means of each said switching circuit comprises a control transistor connected to receive a control signal and to apply the controlling potential to said emitter of said first transistor.

8. A network as defined in claim 1 wherein each said crosspoint switching circuit comprises a further transistor connected to said first transistor in common emitter configuration to form a differential amplifier.

9. A network as defined in claim 8 wherein each said switching circuit comprises a stabilizing resistor connected in circuit with the emitters of said first and further transistors and said control means of each said switching circuit comprises a control transistor connected to receive a control signal and to apply the controlling potential to said emitters of said first and further transistors.

10. A network as defined in claim 1 wherein each said self-blocking stage is connected to the outputs of a plurality of said switching circuits which are all associated with the same column.

* * * * *